United States Patent
Chen

(10) Patent No.: US 8,754,513 B1
(45) Date of Patent: Jun. 17, 2014

(54) LEAD FRAME APPARATUS AND METHOD FOR IMPROVED WIRE BONDING

(75) Inventor: Chender Chen, Fongyuan (TW)

(73) Assignee: Marvell International Ltd., Hamilton (BM)

( * ) Notice: Subject to any disclaimer, the term of this patent is extended or adjusted under 35 U.S.C. 154(b) by 617 days.

(21) Appl. No.: 12/485,428

(22) Filed: Jun. 16, 2009

Related U.S. Application Data

(60) Provisional application No. 61/079,603, filed on Jul. 10, 2008.

(51) Int. Cl.
*H01L 23/495* (2006.01)
*H01L 23/48* (2006.01)
*H01L 23/52* (2006.01)
*H01L 29/40* (2006.01)

(52) U.S. Cl.
USPC ........... 257/676; 257/666; 257/669; 257/670; 257/773; 257/784; 257/E23.501; 257/E21.506

(58) Field of Classification Search
USPC .......... 257/676, 784, E23.031, E21.506, 666, 257/669, 670, 773
See application file for complete search history.

(56) References Cited

U.S. PATENT DOCUMENTS

| | | | | |
|---|---|---|---|---|
| 5,168,368 A | * | 12/1992 | Gow et al. | 257/666 |
| 5,468,993 A | * | 11/1995 | Tani | 257/676 |
| 5,640,044 A | * | 6/1997 | Takehashi et al. | 257/666 |
| 5,757,067 A | * | 5/1998 | Inaba | 257/666 |
| 5,811,874 A | * | 9/1998 | Lee | 257/666 |
| 5,814,877 A | * | 9/1998 | Diffenderfer et al. | 257/666 |
| 5,914,528 A | * | 6/1999 | Takiar et al. | 257/666 |
| 5,949,132 A | * | 9/1999 | Libres et al. | 257/666 |
| 6,133,623 A | * | 10/2000 | Otsuki et al. | 257/666 |
| 6,225,685 B1 | * | 5/2001 | Newman et al. | 257/666 |
| 6,339,252 B1 | * | 1/2002 | Niones et al. | 257/666 |
| 6,476,472 B1 | * | 11/2002 | Davison et al. | 257/678 |
| 6,552,417 B2 | * | 4/2003 | Combs | 257/666 |
| 6,770,963 B1 | * | 8/2004 | Wu | 257/691 |
| 6,798,046 B1 | * | 9/2004 | Miks | 257/666 |
| 6,806,564 B2 | * | 10/2004 | Terui et al. | 257/691 |
| 6,882,035 B2 | * | 4/2005 | Tatt et al. | 257/676 |
| 7,230,323 B2 | * | 6/2007 | Lee et al. | 257/670 |
| 2003/0127711 A1 | * | 7/2003 | Kawai et al. | 257/666 |
| 2004/0061204 A1 | * | 4/2004 | Han et al. | 257/666 |
| 2004/0120128 A1 | * | 6/2004 | Chang | 361/764 |
| 2005/0006735 A1 | * | 1/2005 | an Tatt et al. | 257/676 |
| 2005/0148116 A1 | * | 7/2005 | Roberts et al. | 438/123 |
| 2006/0017142 A1 | * | 1/2006 | Jang et al. | 257/672 |
| 2006/0131725 A1 | * | 6/2006 | Ali et al. | 257/691 |
| 2008/0054421 A1 | * | 3/2008 | Dimaano et al. | 257/676 |
| 2008/0258280 A1 | * | 10/2008 | Seo | 257/676 |
| 2009/0014851 A1 | * | 1/2009 | Choi et al. | 257/676 |
| 2011/0001228 A1 | * | 1/2011 | Tanaka et al. | 257/676 |

FOREIGN PATENT DOCUMENTS

EP 513591 A2 * 11/1992 ............ H01L 23/495
JP 60254755 A * 12/1985 ............. H01L 23/12

* cited by examiner

Primary Examiner — Teresa M Arroyo

(57) ABSTRACT

In one embodiment, the present invention includes a lead frame for accommodating a semiconductor die. The lead frame includes a die attach pad, a first plurality of conductive finger ends, and a second plurality of conductive finger ends. The first plurality of conductive finger ends are arranged within a first elongated region. This first elongated region is located along the first edge of the die attach pad. The second plurality of conductive finger ends is arranged within a second elongated region. The second elongated region has an end adjacent to an end of the first elongated region. The second elongated region is positioned at an angle that is greater than ninety degrees from the first elongated region.

7 Claims, 4 Drawing Sheets

LEAD FRAME APPARATUS AND METHOD FOR IMPROVED WIRE BONDING

CROSS REFERENCE TO RELATED APPLICATIONS

This application claims the benefit of priority from U.S. Provisional Application No. 61/079,603, filed Jul. 10, 2008, entitled "Non-Square Exposed Pad L/F Design" the entire disclosure of which is hereby incorporated herein by reference.

BACKGROUND

The present invention relates to semiconductor device packages, and in particular, to lead frame apparatus and method for improved wire bonding in manufacturing of a semiconductor device.

In semiconductor device packaging, the semiconductor chip is electrically connected to outside circuitry by a lead frame. An example lead frame may be a solid metal frame with fingers radiating inward from opposing sides. At a center of the fingers may be a die attach pad or paddle where a semiconductor die may be attached.

The electrical connections of the semiconductor die may be made by wire bonding from pads located on top of the semiconductor die to finger ends of the metal lead frame. The semiconductor die and a portion of the lead frame fingers are then encapsulated or molded in a material such as an epoxy or plastic molding compound, and the molded package body and lead frame fingers are cut from the frame. The lead frame fingers are then formed to provide a means of electrically connecting the package to a printed circuit board. The severed fingers therefore constitute the I/O (Input/Output) leads for the semiconductor device (a.k.a. a micro chip).

FIG. 1A illustrates a semiconductor device 100 which utilizes a typical lead frame. Semiconductor device 100 shows a dashed line indicating a die attach pad 101 within the mold compound, a dashed line indicating a semiconductor die 102 within the mold compound, and a dashed line indicating a portion 103 of the semiconductor device 100. FIG. 1B illustrates the portion 103 of the semiconductor device 100 of FIG. 1A in a cut-away view. Die 102 is attached to die attach pad 101.

The typical lead frame shown in FIG. 1B has long bond wire lengths (e.g. distance 120) and small distances between bond pads (e.g. distance 116) which may cause electrical shorts during manufacturing. During the molding process, wire bonds may be moved (i.e. wire sweep) during the flowing and curing of the mold compound. Adjacent bond wires with short lengths and ample spacing between the bond wires may not move much and therefore are less likely to short together. However, adjacent bond wires that are longer (e.g. bond wires 106 and 107) or with less spacing between them (e.g. bond wires 104 and 105) may be more likely to electrically short together during the molding process.

The typical lead frame has a problem with the length of the bond wires which attach to the corner regions of the lead frame. For example, bond wires 106-107 attach corner lead frame fingers 114-115 to bond pads 110-111, respectively. Distance 120 is longer than a distance traversed by bond wire 104 or 105. Fingers 114-115 extend out in the x direction away from the corner of die 102 due to the minimum width available in manufacturing a lead frame finger.

Another problem with the typical lead frame concerns the distance between bond wires. This may be especially problematic when the density of bond pads is disproportionately arranged on a semiconductor die. For example, example die 102 has more bond pads per unit area on side A as compared to side B. In this case, the bond pads on side A (e.g. bond pads 108-111) may require bond wires which attach to fingers which are not on the same side of the lead frame. For example, fingers 112-115 are utilized to attach to bond pads 108-111 located along side A. An angle of approach 119 results in a distance 117 between bond wires 106 and 107. An angle of approach 118 results in a distance 116 between bond wires 104 and 105.

Thus, it would be desirable to provide lead frames with improved wire bonding.

SUMMARY

Embodiments of the present invention includes a lead frame apparatus and method for improved wire bonding. In one embodiment, the present invention includes a lead frame comprising a die attach pad and first and second pluralities of conductive finger ends. The first plurality of conductive finger ends is arranged within a first elongated region, where the first elongated region is located along a first edge of the die attach pad. The second plurality of conductive finger ends is arranged within a second elongated region, where the second elongated region has an end adjacent to an end of the first elongated region. The second elongated region is positioned at an angle that is greater than 90 degrees and less than 180 degrees from the first elongated region.

In one embodiment, the die attach pad has a second edge and the second elongated region is located along the second edge.

In one embodiment, the die attach pad includes a chamfered edge, and the second elongated region is aligned with the chamfered edge.

In one embodiment, the angle is approximately 135 degrees.

In one embodiment, the lead frame further comprises a third plurality of conductive finger ends arranged within a third elongated region, where the third elongated region is located along a second edge of the die attach pad. The third elongated region has an end adjacent to a second end of the second elongated region. The second elongated region is positioned at a second angle that is greater than 90 degrees from the third elongated region.

In one embodiment, the lead frame further comprises a first elongated conductive region positioned between the first elongated region and the first edge of the die attach pad, and a second elongated conductive region positioned between the second elongated region and a second edge of the die attach pad, where the first elongated conductive region forms an angle greater than 90 degrees with the second elongated conductive region.

In one embodiment, the lead frame further comprises a tab coupled to the second elongated conductive region.

In another embodiment, the present invention includes a semiconductor device package comprising a first plurality of conductive lead frame fingers with one end of each finger facing an first edge of a semiconductor die, and a second plurality of conductive lead frame fingers with one end of each finger facing a corner of the semiconductor die, where a first conductive lead frame finger of the first plurality of conductive lead frame fingers is adjacent to a second conductive lead frame finger of the second plurality of conductive lead frame fingers. The corner of the semiconductor die is located a first distance from an end of the first conductive lead frame finger, and a second distance from the corner to an end of one or more lead frame fingers of the second plurality of conductive lead frame fingers is less than the first distance.

In one embodiment, the semiconductor device package further comprises a die attach pad having a chamfered edge, where the second plurality of conductive lead frame fingers are aligned with the chamfered edge.

In one embodiment, the semiconductor device package further comprises a first elongated conductive region positioned between the first plurality of conductive lead frame fingers and the first edge of the semiconductor die, and a second elongated conductive region positioned between the second plurality of conductive lead frame fingers and the corner of the semiconductor die, where the first elongated conductive region forms an angle greater than 90 degrees with the second elongated conductive region. In one embodiment, the angle is approximately 135 degrees.

In one embodiment, the semiconductor device package further comprises a tab coupled to the second elongated conductive region.

In one embodiment, the semiconductor device package further comprises a third plurality of conductive lead frame fingers with one end of each finger facing a second edge of the semiconductor die, where a third conductive lead frame finger of the second plurality of conductive frame fingers is adjacent to a fourth conductive lead frame finger of the third plurality of conductive lead frame fingers, where the corner of the semiconductor die is located a third distance from an end of the fourth lead frame finger, and where a fourth distance from the corner to an end of one or more lead frame fingers of the second plurality of conductive lead frame fingers is less than the third distance.

In another embodiment, the present invention includes a method of manufacturing a semiconductor device comprising attaching a semiconductor die to a die attach pad of a lead frame, where the lead frame has a first plurality of conductive fingers positioned along a first edge of the semiconductor die and a second plurality of conductive fingers positioned to face a corner of the semiconductor die, bonding a first wire between a first bond pad of the semiconductor die and a first conductive finger of the first plurality of conductive fingers, the first bond pad being proximate with the corner of the semiconductor die, and bonding a second wire between a second bond pad of the semiconductor die and a second conductive finger of the second plurality of conductive fingers, the second bond pad being proximate with the corner of the semiconductor die. A first finger at a first end of the first plurality of conductive fingers is adjacent to a second finger at a first end of the second plurality of conductive fingers, and wherein the first plurality of conductive fingers are positioned at an angle that is greater than 90 degrees and less than ISO degrees from the second plurality of conductive fingers.

In one embodiment, the lead frame has a third plurality of conductive fingers positioned along a second edge of the semiconductor die, and the method further comprises bonding a third wire from a third bond pad of the semiconductor die to a third conductive finger of the third plurality of conductive fingers, the third bond pad being proximate with the corner of the semiconductor die, where a third finger at a first end of the third plurality of conductive fingers is adjacent to a fourth finger at a second end of the second plurality of conductive fingers, and wherein the third plurality of conductive fingers are positioned at an angle that is greater than 90 degrees and less than 180 degrees from the second plurality of conductive fingers.

In one embodiment, the method further comprises bonding a third wire from a third bond pad of the semiconductor die, the third bond pad being proximate with the corner of the semiconductor die, where a first elongated conductive region is positioned between the first plurality of conductive fingers and the first edge and a second elongated conductive region is positioned between the second plurality of conductive fingers and the semiconductor die, and where the third wire is bonded to the second elongated conductive region. In one embodiment, the angle is approximately 135 degrees.

The following detailed description and accompanying drawings provide a better understanding of the nature and advantages of the present invention.

DETAILED DESCRIPTION

Described herein is a lead frame apparatus and method for improved wire bonding in manufacturing of a semiconductor device. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1B:
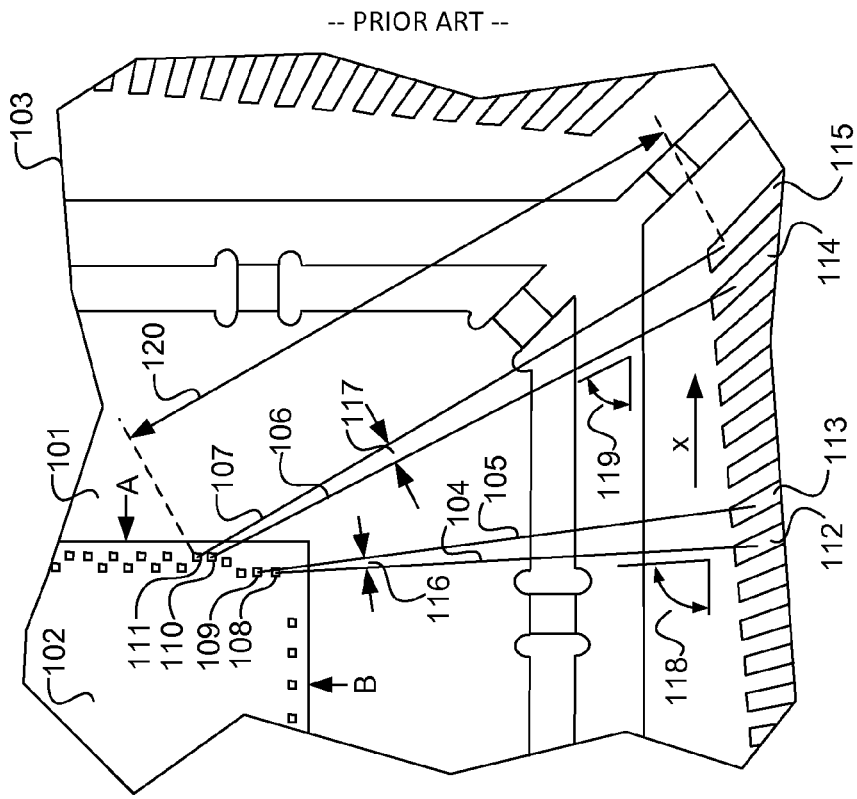
FIG. 1B illustrates the portion of the semiconductor device 103 of FIG. 1A in a cut-away view.
Figure 1A:
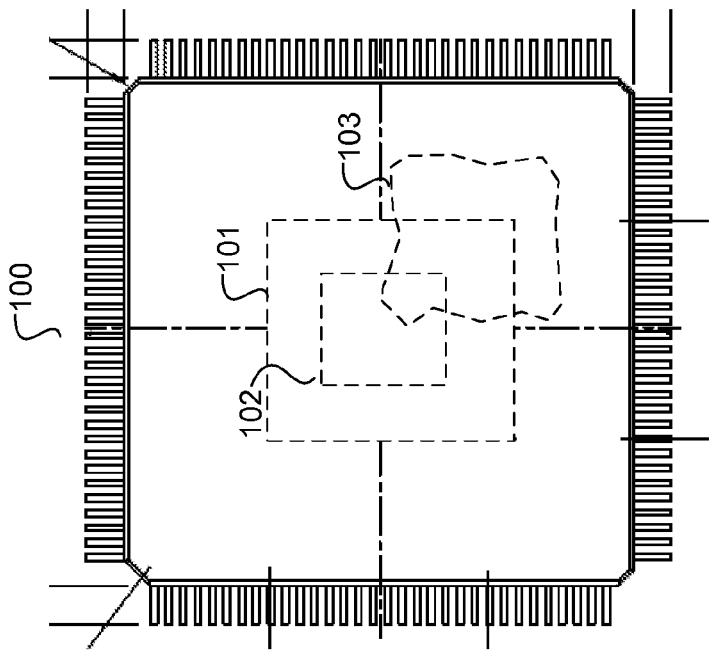
FIG. 1A illustrates a semiconductor device 100 which utilizes a typical lead frame.
Figure 2:
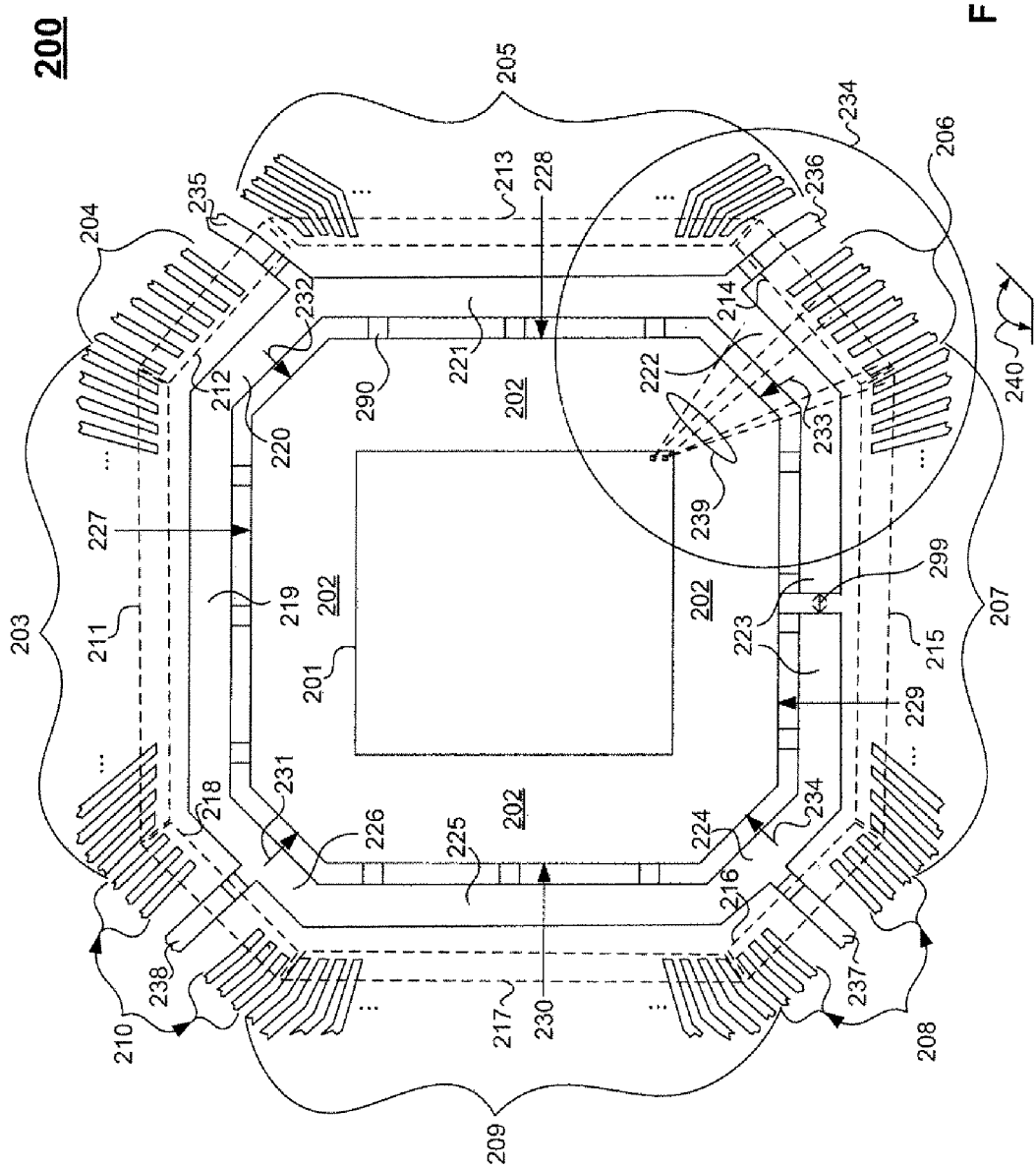
FIG. 2 illustrates internal detail of a semiconductor device package according to one embodiment of the present invention.

FIG. 2 illustrates internal details of a semiconductor device package 200 according to one embodiment of the present invention. A semiconductor die 201 is attached to a die attach pad (DAP) 202. In this example, DAP 202 is an octagonal planar region with semiconductor die 201 attached approximately in the center, for example (reference numerals 202 are shown in FIG. 2 around the four sides of die 201). The lead frame includes DAP 202, conductive regions 219-226, and pluralities of conductive fingers 203-210. The conductive regions 219-226 and pluralities of conductive fingers 203-210 surround DAP 202. Tabs 235-238 may provide support for the DAP 202 during the manufacturing process. Pluralities of conductive fingers 204, 206, 208, and 210 are arranged at angles with conductive fingers 203, 205, 207, and 209 to provide improved wire bonding for manufacturability and reliability.

DAP 202 has corners which are chamfered and conductive regions 220, 222, 224, and 226 are angled according to the chamfered portions of DAP 202. The ends of the conductive fingers 203 are arranged within elongated region 211, which is located along edge 227 of DAP 202. The ends of conductive fingers 204 are arranged within another elongated region 212. In this example, elongated region 212 has an end adjacent to an end of elongated region 211 and is located along edge 232 of DAP 202.

Additionally, the ends of conductive fingers 205 are arranged within elongated region 213 which is located along edge 228 of DAP 202. An end of elongated region 213 is adjacent to an end of elongated region 212. The ends of conductive fingers 206 are arranged within another elongated region 214. Elongated region 214 is located along edge 233 of DAP 202 and has an end adjacent to an end of elongated region 213.

Similarly, the ends of the conductive fingers 207 are arranged within elongated region 215 which is located along edge 229 of DAP 202. Elongated region 215 is adjacent to an end of elongated region 214. The ends of conductive fingers 208 are arranged within elongated region 216. Elongated region 216 is located along edge 234 of DAP 202 and has an end adjacent to an end of elongated region 215.

Likewise, the ends of the conductive fingers 209 are arranged within elongated region 217 which is located along edge 230 of DAP 202. Elongated region 217 is adjacent to an end of elongated region 216. The ends of conductive fingers 210 are arranged within elongated region 218. Elongated region 218 is located along edge 231 of DAP 202 and has an end adjacent to an end of elongated region 217. Elongated region 211 is adjacent to an end of elongated region 217.

Adjacent elongated regions have an angle of greater than 90 degrees between them. For example, elongated regions 215 and 214 are adjacent. An angle 240 between elongated regions 215 and 214 is greater than 90 degrees and less than 180 degrees. In this embodiment, the angle is 135 degrees, but other angles are also possible. In this embodiment elongated regions pairs on opposite sides of the frame 211/215, 213/217, 212/216, and 214/218 are parallel to each other.

Elongated conductive regions 219-226 surround DAP 202. These elongated regions may provide a ground plane that is accessible to the bond pads located on each side of the die. Elongated conductive regions 220, 222, 224, and 226 may provide ground plane access to the corners regions of die 201.

Elongated conductive region 219 is positioned between elongated region 211 and edge 227 of DAP 202. Additionally, elongated conductive region 220 is positioned between elongated region 212 and edge 232. Similarly, elongated conductive region 221 is positioned between elongated region 213 and edge 228 of DAP 202. Likewise, elongated conductive region 222 is positioned between elongated region 214 and edge 233.

Elongated conductive region 223 is positioned between elongated region 215 and edge 229 of DAP 202. Elongated conductive region 224 is positioned between elongated region 216 and edge 234. Elongated conductive region 225 is positioned between elongated region 217 and edge 230 of DAP 202. Elongated conductive region 226 is positioned between elongated region 218 and edge 231.

The elongated conductive regions 219-226 are all electrically connected in this embodiment. Elongated conductive region 223 includes a space 299 between two portions of the elongated conductive region 223. Both portions of conductive region 223 on either side of the space are electrically shorted to each other by the continuous metal which connects the other conductive regions around the perimeter of the DAP 202. The conductive regions are further electrically coupled to DAP 202 through DAP supports, such as support 290. The adjacent elongated conductive regions have angles which are greater than 90 degrees in a similar manner as the adjacent elongated regions 214 and 215 described above.

The lead frame includes tabs 235-238, which may be made of a conductive materials such as metal. Tabs 235-238 provide support for the DAP 202 during the manufacturing process. Tabs may be positioned within the angled elongated regions and separate conductive finger ends. For example, tabs 237 and 238 are positioned in the center of regions 216 and 218, respectively. In contrast, tab 236 is to one end of elongated region 214. This may be done to allow more ends of the conductive fingers 206 to be adjacent to the ends of the conductive fingers 207, for example. Tab 235 is also to one end of elongated region 212. This may be done to improve bonding angles when die 201 includes a high density of bond pads on one side of die 201.

Figure 3:
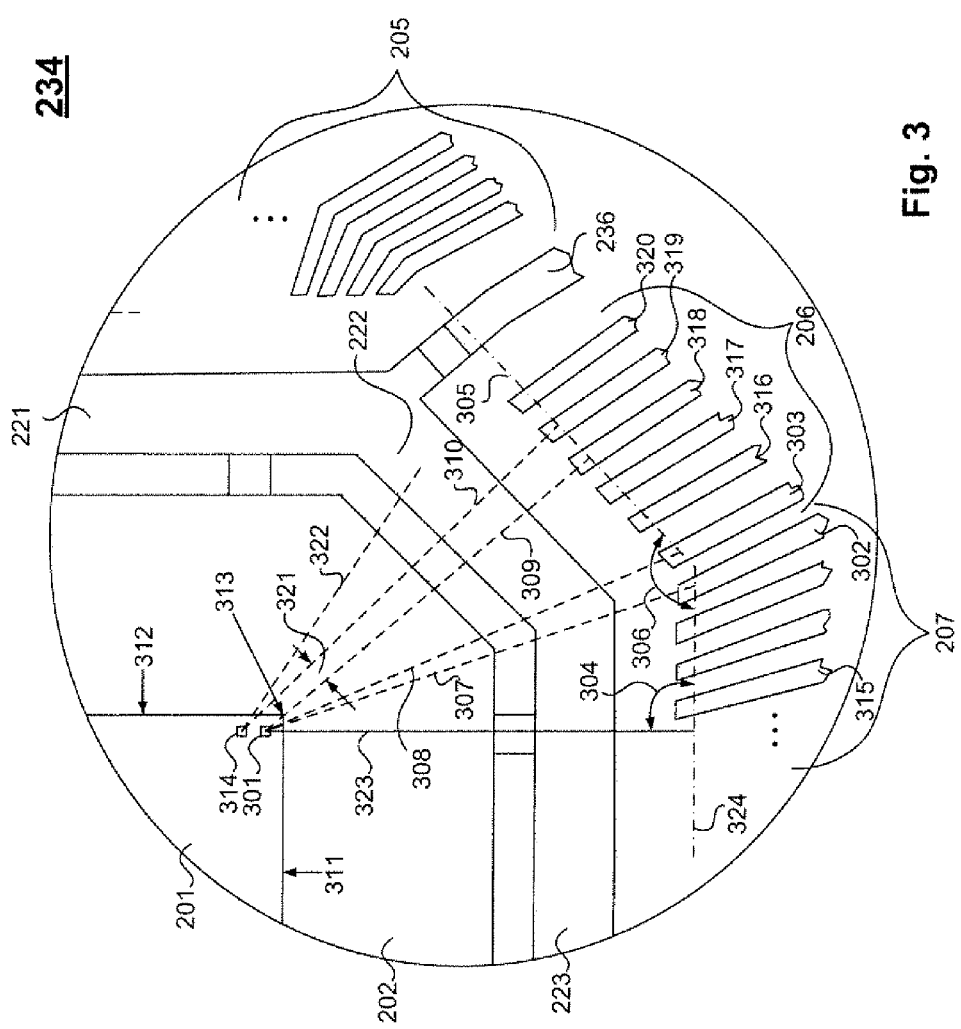
FIG. 3 illustrates a portion of the semiconductor package of FIG. 2 in more detail.

FIG. 3 illustrates a portion of the semiconductor package 200 of FIG. 2 in more detail. Semiconductor die 201 has bond pads 301 and 314 proximate with corner 313. Semiconductor die 201 also has edge 311 and 312. Conductive lead frame fingers 207 have ends facing edge 311. Conductive lead frame fingers 205 have ends facing edge 312. However, conductive lead frame fingers 206 have ends facing corner 313. Lead frame finger 302 of the conductive lead frame fingers 207 is adjacent lead frame finger 303 of the lead frame fingers 206.

Angle 306 may be formed between the ends of the pluralities of lead frame fingers 206 and 207. This angle 306 between adjacent lead frame fingers 206 and 207 may improve bonding angles and distance to a bond pad proximate to corner 313 (e.g. bond pads 301 and 314). Line 324 indicates where a bond wire may contact an end of the lead frame fingers 207, and line 305 indicates where a bond wire may contact an end of the lead frame fingers 206. Angle 306 is greater than 90 degrees. In this embodiment the angle 306 is approximately 135 degrees. Line 323 identifies a minimum length a wire may have between bond pad 301 and a finger end of the lead frame fingers 207. Line 323 and line 324 form an angle 304 which is approximately 90 degrees. Bond wire 307 will geometrically have a greater length than a bond wire from the end of lead frame finger 315 to bond pad 301. Bond wire 308 may have approximately the same length as bond wire 307. However, bond wires from bond pad 301 to an end of one or more lead frame fingers (316-320) of the lead frame fingers 206 may be less than a distance covered by bond wire 307.

Angle 306 may also increase a separation between bond wires. For example, bond wires 309 and 310 have a separation 321 between them which is influenced by angle 306. If angle 306 is increased by 20 degrees, the separation between bond wires 309 and 310 may become too close and increase the likelihood of shorts due to manufacturing variances.

Elongated conductive region 222 is approximately at an angle that is close to angle 306 to elongated conductive region 223. A bond wire 322 may be bonded from bond pad 314 to elongated conductive region 222. The angle between the elongated conductive regions 222 and 223 may allow the bond wires to approach a bond pad at an angle of approach which may increase the separation between adjacent bond wires.

While the above description has highlighted the advantages of the invention using an example lead frame with eight regions of fingers (e.g., 211-218) forming an octagon, it is to be understood that other arrangements are also possible in other embodiments of the present invention. For example, more or fewer regions for the fingers may be used. Additionally, the regions may be curved, for example.

Figure 4:
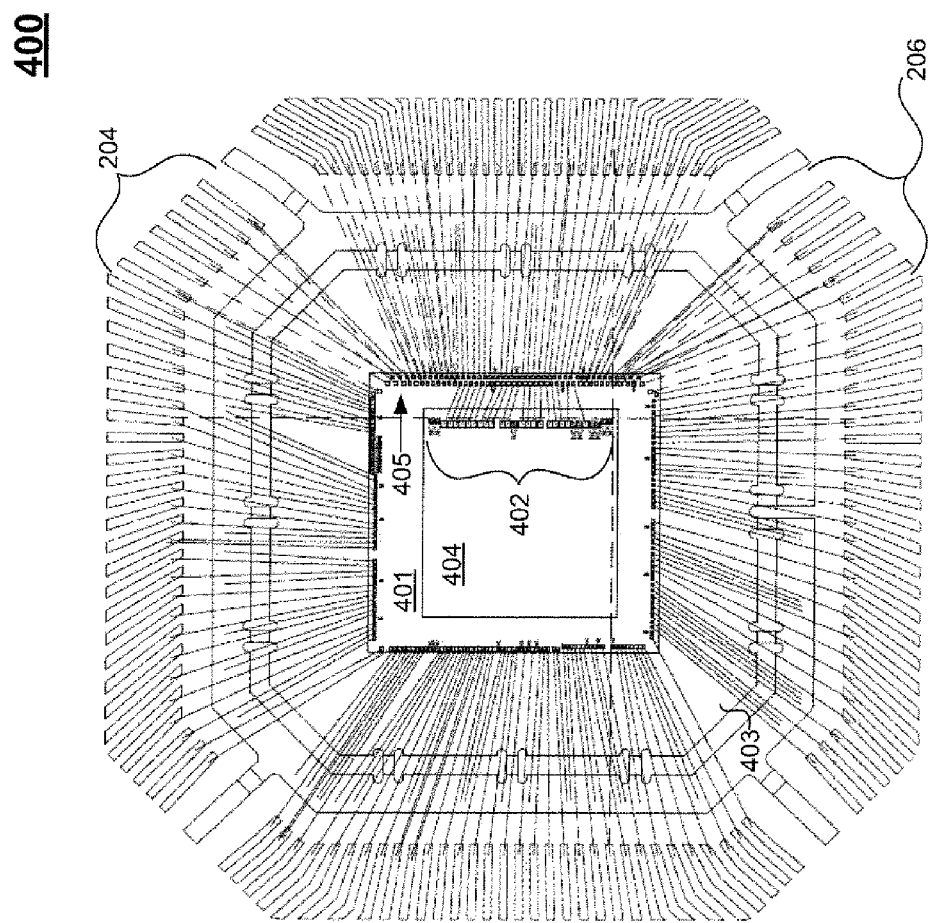
FIG. 4 illustrates internal detail of a semiconductor device package after assembly according to another embodiment of the present invention.

FIG. 4 illustrates internal details of a semiconductor device package after assembly 400 according to another embodiment of the present invention. Die 401 is attached to die attach pad 403 of the semiconductor device package 400. Die 401 may have a stacked die 404 attached to its top surface. Stacked die 404 has bond wire connections 402 to die 401.

The bond wires indicated with solid lines represent low profile bond wire connections and the bond wires indicated with dashed lines represent high profile bond wire connections. The high profile bond wire connections may vertically arch above the arches formed by the low profile bond wire connections. Side 405 contains a higher density of bond wire connections. The distances and approach angles provided by conductive fingers 204 and 206 may improve bond wire spacing and manufacturability.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A lead frame comprising:
    a die attach pad;
    a first plurality of conductive finger ends arranged within a first elongated region, wherein the first elongated region is located along a first edge of the die attach pad, and wherein each of the first plurality of conductive finger ends faces the first edge of the die attach pad;
    a second plurality of conductive finger ends arranged within a second elongated region, wherein the second elongated region has an end adjacent to an end of the first elongated region; and
    a plurality of elongated conductive regions arranged around the die attach pad,
    wherein the plurality of elongated conductive regions comprise (i) a first elongated conductive region positioned between the first elongated region and the first edge of the die attach pad and (ii) a second elongated conductive region positioned adjacent to the first elongated conductive region,
    wherein the first elongated conductive region comprises (i) a first section and (ii) a second section,
    wherein the first section is separated from the second section by a space between the first section and the second section,
    wherein the first section is electrically coupled to the second section via the second elongated conductive region, and
    wherein the second elongated region is positioned at an angle that is greater than 90 degrees and less than 180 degrees from the first elongated region.

2. The lead frame of claim 1, wherein:
    the die attach pad has a second edge;
    the second elongated region is located along the second edge; and
    each of the second plurality of conductive finger ends faces the second edge of the die attach pad.

3. The lead frame of claim 1, wherein the die attach pad includes a chamfered edge, and wherein the second elongated region is aligned with the chamfered edge.

4. The lead frame of claim 1, wherein the angle is approximately 135 degrees.

5. The lead frame of claim 1, further comprising:
    a third plurality of conductive finger ends arranged within a third elongated region,
    wherein the third elongated region is located along a third edge of the die attach pad, and wherein each of the third plurality of conductive finger ends faces the third edge of the die attach pad,
    wherein the third elongated region has an end adjacent to a second end of the second elongated region, and
    wherein the second elongated region is positioned at a second angle that is greater than 90 degrees from the third elongated region.

6. The lead frame of claim 1, wherein the first elongated conductive region forms an angle greater than 90 degrees with the second elongated conductive region.

7. The lead frame of claim 6, further comprising a tab coupled to the second elongated conductive region.

\* \* \* \* \*